Sept. 22, 1959 H. C. GOODRICH 2,905,815

TRANSISTOR, OPERATING IN COLLECTOR SATURATION CARRIER-STORAGE REGION, CONVERTING PULSE AMPLITUDE TO PULSE DURATION

Filed Aug. 26, 1953

INVENTOR.
Hunter C. Goodrich
BY [signature]
ATTORNEY

United States Patent Office 2,905,815

Patented Sept. 22, 1959

2,905,815

TRANSISTOR, OPERATING IN COLLECTOR SATURATION CARRIER-STORAGE REGION, CONVERTING PULSE AMPLITUDE TO PULSE DURATION

Hunter C. Goodrich, Collingswood, N.J., assignor to Radio Corporation of America, a Delaware corporation Application August 26, 1953, Serial No. 376,713

14 Claims. (Cl. 250—20)

The present invention relates to improvements in signal processing circuits and more particularly, although not necessarily exclusively, to signal processing circuits designated to communicate signal waveforms having a pulse type component of relatively low duty cycle.

More directly, the present invention relates to improvements in signal processing circuits for controlling the effective duty cycle of signals caused to pass therethrough.

In one of its more specific forms, the present invention relates to improvements in signal processing circuits in which signal extremities are to be defined and/or limited by processing circuit action yet develop an indicating potential representing the original amplitude of signal applied to the circuit, such latter circuit action being useful in automatic gain control circuits for television receivers.

In the communications art it is frequently found desirable to provide some means for controllably extending the effective duration of a given electrical signal. In the prior art this has been oftentimes accomplished through the utilization of one or more multivibrator circuits whose cycling period is made of greater duration than the synchronizing or actuating pulse applied thereto. Means have also been provided in connection with such pulse widthening circuits for controlling the cycling period of the multivibrator in accordance with a control signal whereby it is made possible to impart different degrees of widthening to successive input pulses. Such circuits, however, are in most instances, apt to be quite vulnerable to operating voltage changes as well as being rather costly in manufacture due to the requirement of a plurality of vacuum tube elements which comprise the multivibrator and control circuits.

The present invention provides a simple, effective and stable signal processing circuit embodying a semiconductor signal translating device in such a way that the effective width or duty cycle of signals applied thereto may be easily controlled. Advantage is taken of that characteristic of semiconductor signal translating devices, such as for example, transistors, which permits a condition of collector saturation to be established under conditions of sufficient collector load impedance and emitter signal current. It has been found that when the threshold of collector saturation has been reached additional signal drive in the direction of collector saturation imparts a widthening effect to the signal appearing in the collector circuit.

The present invention, therefore, provides means for controlling the degree of signal saturation in a semiconductor signal translating device whereby to control the effective duty cycle of the signal communicated by the device.

In one of its more specific applications, the present invention makes possible an operating improvement in the signal processing arrangement of copending U.S. patent application, Serial No. 376,193, filed August 24, 1953, Patent No. 2,864,888, entitled Automatic Gain Control Circuits by Hunter C. Goodrich, in which a semiconductor signal translating device such as a transistor is caused to effect double-clipping of television synchronizing signal information and at the same time develop a direct current voltage representing the peak amplitude of applied television signal so as to be suitable for automatic gain control purposes. The present invention permits an additional circuit gain to be realized in the development of the automatic gain control potential, per se, without sacrificing signal clipping action.

It is, therefore, an object of the present invention to provide an improved signal processing circuit, capable of imparting a controllable widthening effect upon the applied signal.

It is further an object of the present invention to provide an improved and simplified pulse widthening circuit embodying semiconductor signal translating devices such as, for example, the transistor.

It is also an object of the present invention to provide an improved combination synchronizing signal clipping circuit and automatic gain control voltage development circuit for use in connection with television signal processing systems.

It is another object of the present invention to provide a signal processing circuit in which the duty cycle of the signal being processed may be controllably altered in accordance with an intelligence or control signal.

Other objects and features of advantage of the present invention as well as a better understanding of its nature and mode of operation, will be obtained from a reading of the following specification, especially when taken in connection with the accompanying drawings, in which:

Figure 1*a* is a schematic representation of a basic semiconductor signal translating circuit adapted for operation in accordance with the present invention. Fig. 1*b* shows a graphical representation of certain operating characteristics of this circuit arrangement.

Figure 1A:
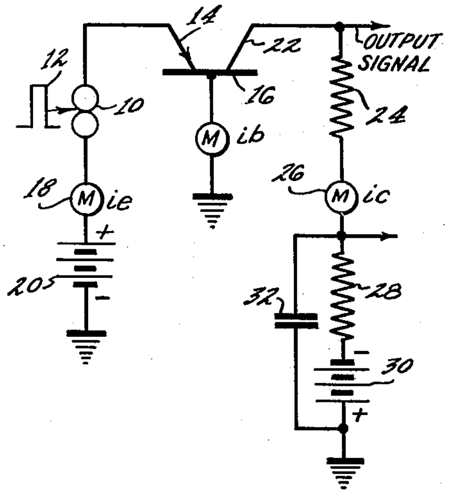

Turning now to Figure 1*a* there is shown at 10 a source of electrical signal having, by way of example, a pulse waveform such as shown at 12. The source 10 is connected between the emitter 14 and base 16 of a semiconductor signal translating device, shown by way of example, as being of the transistor variety and equivalent, for the purposes of the description to follow, to a P-N-P junction transistor. Also connected in the emitter-base circuit and in series with the signal source 10 is a current indicating meter 18 and forward biasing voltage source 20. The collector 22 of the semiconductor device is connected through a load resistor 24, current indicating meter 26, and another load resistor 28 to a source of reverse biasing potential 30, such as is required to obtain transistor action in a semiconductor device. The load resistor 28 is shown bypassed to circuit ground by a capacitor 32.

Figure 1B:
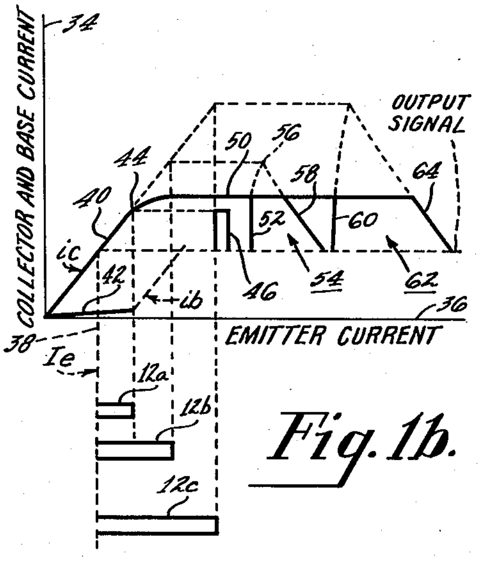

In the operation of the embodiment of the present invention shown in Figure 1*a*, it will be assumed that the bias source 20 provides a forward emitter bias current measurable by meter 18 as of value $I_e$, as shown in the graph of Figure 1*b*. The graph of Figure 1*b* is a plot of collector and base current along the ordinate 34 against emitter current along the abscissa 36. The forward bias current $I_e$ is indicated by the vertical dotted line 38. In the graph of Figure 1*b* collector current is represented by the line 40 designated as $i_c$ and measurable by meter 26, for different values of emitter current. Different values of base current ($i_b$) as a function of emitter current is shown by the line 42. As the signal 12 causes the emitter current to increase as indicated at 12*a* in Figure 1*b*, the collector current $i_c$ is seen to rise linearly up to a point 44 whereby to define an output pulse 46 of substantially the same waveform as the input pulse 12*a*.

Should, however, the amplitude of the signal 12 increase as shown at 12*b* in Figure 1*b*, collector current saturation will occur at a point when the potential of the collector 22 in Figure 1*a* reaches a potential substantially equal to the potential of the base 16. At this point it is believed that no further charge carriers (positive carriers, or holes, in the case of the P-N-P transistor) will be attracted and neutralized by the collector. Collector current will, therefore, rise no further as a function of increased emitter current as illustrated by the horizontal portion of the curve 40 shown at 50. Since, however, the emitter current has increased, that is, more holes are injected into the semiconductor material by the emitter 14, electrons will enter the base material to neutralize the field of the additional holes injected in the base material as a body. This will constitute increased base current as shown by the rising portion of the curve 42 once collector saturation obtains. The gradual increase of base current with emitter current up to the point of saturation is due to normal emitter-base current flow. Thus, in the case of the wavefom 12*b*, the collector current will rise quite rapidly as indicated by the front edge 52 of the output waveform 54. The dotted line extension 56 of the front edge 52 is merely illustrative of the effective or virtual increase of carrier density in the semiconductor which would otherwise constitute a current, if collector saturation had not occurred.

Maximum charge carrier density within the base of the material will be reached at the trailing edge of the signal pulse 12*b*. As the emitter current drops in accordance with the trailing edge of the input pulse 12*b*, a reverse direction component of base current will be established until the emitter-base current drops to a value corresponding to the point at which collector saturation occurred. At this point, the potential of the collector relative to the base will be sufficiently negative to attract the positive charge carriers which have built up a considerable surplus. Once the collector electrode begins to rise in potential due to decreased collector current such as shown at 58 (wavefom 54) the surplus charge carriers will be neutralized at the normal transistor rate but this neutralization period will be extended due, it is believed, to the built-up or stored excess of charge carriers during the initial period when the collector was driven into saturation. This will extend or prolong the pulse period by delaying the trailing edge of pulse 12*b*.

From the above, it follows that the further the semiconductor device is driven into collector saturation, the greater will be the build-up of charge carriers having no place to go because of the saturated condition of the collector. The greater the build-up of the charge carriers, the longer it will take for the carriers to be neutralized at the collector, once collector current starts to rise. This is exemplified by the pulse 12*c* having amplitude in excess of the previously discussed pulse 12*b*. The front edge of the pulse 12*c* will cause collector current increase as shown at 60 of output waveform 62, the emitter current will continue to rise even if collector saturation has occurred to establish a surplus of charge carriers within the semiconductor body. At the end of the pulse 12*c* the emitter-base current will drop and hole neutralization at the collector will commence on a gradual basis to define the trailing edge 64 of the output signal 62.

It is noted that the utility of the present invention is in no way limited by the particular explanation given above in accounting for the pulse widthening effect of the circuit shown. In addition to the pulse widthening effect produced by the above phenomenon occurring with collector saturation, it is known that there is a statistical distribution of charge carrier velocities within a semiconductor body under the condition of saturation. It is entirely conceivable that a certain amount of pulse widthening effect may be attributable to the fact that between the normal bias current $I_e$ and saturation level 50 in Figure 1*b* a majority of the faster charge carriers are utilized. On the other hand, from the saturation level 50 to the peak emitter current defined by the input pulse extending beyond saturation, the slower charge carriers are employed. Although the known velocity range of charge carriers in a semiconductor body is insufficient to account for the degree of pulse widthening sometimes observed in the practice of the present invention, it is contemplated that this effect is of sufficient importance to be borne in mind in analyzing some operational modes.

Figure 2:
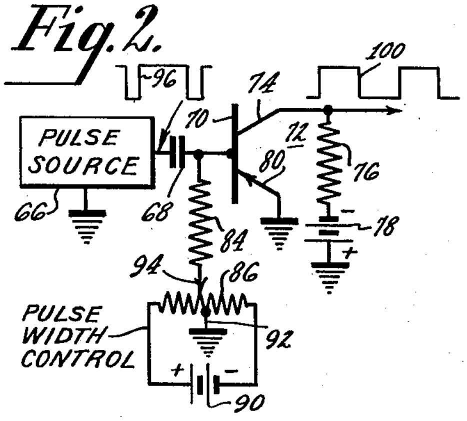
Figure 2 is a combination block and schematic representation of a controllable pulse widthening circuit embodying the novel features of the present invention.

The embodiment of the present invention shown in Figure 2 merely carries out the technique described in connection with Figure 1 and applies it to a practicable form of pulse widthening circuit. Here a source of pulse signals 66 is capacitively coupled by capacitor 68 to the base electrode 70 of a semiconductor signal translating device 72. The collector 74 of the device is connected through a load resistor 76 to a source of reverse collector bias potential 78. The emitter 80 of the semiconductor device is connected directly with circuit ground while the base 70 is connected through a load resistor 84 to a source of adjustable emitter-base bias current. This adjustable bias current source comprises a bleeder resistor 86 connected in shunt with a source of potential 90. A tap on the bleeder 86 is connected with circuit ground as shown at 92. By adjusting the variable tap 94 on the bleeder 86, a range of bias values (such as $I_e$, Figure 1*b*) may be manually provided. If the amplitude of the input pulses 96 is made sufficiently high and the value of the resistor 76 sufficiently high so that the semiconductor device is driven well into collector saturation, the width of the output pulses 100 may be manually controlled. For example, if the tap 94 on the bleeder 86 is moved to the left (in the drawings) to a more negative potential, the forward emitter-base $I_e$ will move to the right in Figure 1*b*. This will permit a given amplitude pulse to drive the semiconductor further into collector saturation so as to result in a wider output pulse.

Figure 3:
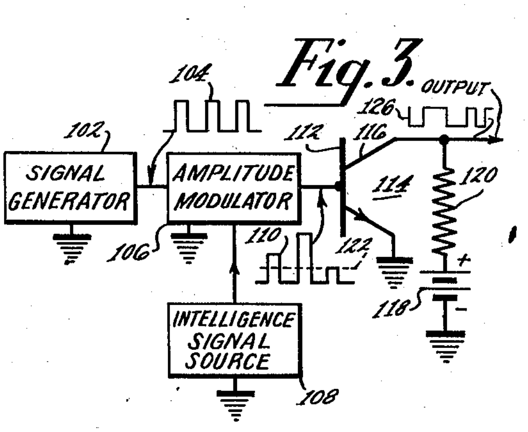
Figure 3 is a combination block and schematic representation of a pulse width signal intelligence communicating system embodying the novel features of the present invention.

The embodiment of the invention shown in Figure 3 illustrates the application of the above discussed principles to a pulse width modulation type signal communication system. In a pulse width modulation type signal communication system, the signal to be transmitted comprises a series of pulses, the widths of which are varied in accordance with signal intelligence. At the received terminal the variation in pulse widths is detected and used to reconstruct the desired intelligence signal.

In Figure 3 a signal generator 102 is shown producing, by way of example, a series of pulses 104 whose amplitude and width are substantially uniform. These pulses are applied to the input circuit of an amplitude modulator 106 which is driven by a source of intelligence signal 108. The amplitudes of the pulses 104 will, therefore, be modulated in accordance with the intelligence signal resulting in a variation in amplitude between successive equal width pulses, such as shown in the pulse train 110. The pulse train 110 is in turn applied to the base 112 of a semiconductor signal translating device 114. The collector 116 of the device is connected with a source of reverse bias potential 118 through a load resistor 120. The semiconductor device 114 is so operated as to be driven into collector saturation by the minimum anticipated amplitude signal such as level 122, which any of the input pulses 110 may assume as a result of intelligence signal modulation. However, as seen above, the greater the amplitude of pulse above the level 122, the greater will be the width of corresponding output pulse developed across the collector load resistor 120. By way of example, the output pulses to be expected from the particular series of input pulses 110 have been shown at 126.

Figure 4:
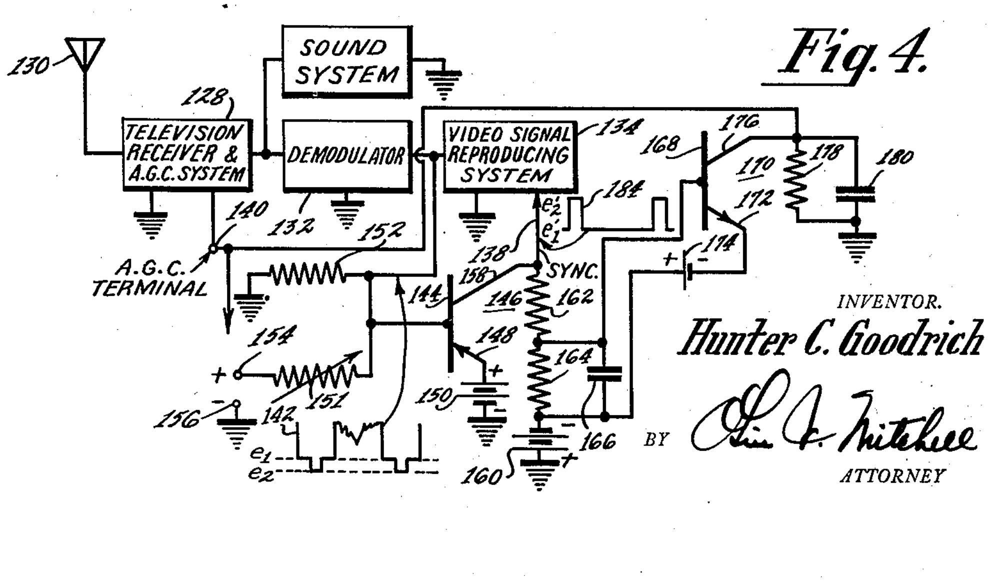
Figure 4 is a combination block and schematic representation of another embodiment of the present invention applied to a television signal receiving system whereby to provide a combination action of double sync clipping and automatic gain control signal development.

In the embodiment of the present invention shown in Figure 4, novel use is made of the pulse widthening effect described above to extend the effective linear emitter to collector signal communicating characteristic of a semiconductor amplifying device such as a transistor to pulse signals even though collector saturation has been established. This is in sharp contrast to the effect observed in vacuum tube amplifying circuits where saturation effects are depended upon to limit signal excursions. In electron tubes once signal or space charge saturation has been reached an increase in applied signal is met with virtually no response in the circuit associated with the "saturated" electrode. In accordance with the present invention, advantage is taken of the increased duty cycle of the signal delivered by a collector saturated semiconductor device which can be translated into a useful output voltage by means of an electrical integrating network. Thus, even though collector saturation effects in a semiconductor amplifier has limited one extremity of signal excursion, a useful output voltage bearing a substantially linear relation to further increases in applied signal may be realized by integrating the voltage variations appearing across the collector circuit load impedance. In the arrangement of Figure 4, advantage is taken of this effect to provide an automatic gain control voltage for a television receiver, a portion of which is represented by the block 128. Broadcast television signals are intercepted by the television antenna 130 and applied to the input circuit of the receiver. Signals delivered by the television receiver and automatic gain control (AGC) system incorporated in block 128 are delivered to a signal demodulator circuit 132 whose output signal is in turn applied to a video signal reproducing system 134. The video signal reproducing system 134 is meant to include a kinescope picture reproducing device and associated synchronized deflection circuits. The synchronized deflection circuits within the block 134 are adapted to receive synchronizing pulses at terminal 138. Automatic gain control voltage for operation of the automatic gain control system with the block 128 is indicated for application to the AGC terminal 140. Separated synchronizing signal for control of the video reproducing system deflection circuits is extracted from the incoming demodulated video signal 142 in accordance with the system disclosed and claimed in the above-identified copending U.S. patent application by H. C. Goodrich, Serial No. 376,193, entitled Automatic Gain Control Circuits, filed August 24, 1953, Patent No. 2,864,888.

According to the synchronizing signal separation system disclosed in the above-mentioned copending U.S. patent application, demodulated video signal 142 is applied to the base 144 of a semiconductor signal translating device such as a transistor 146. The emitter 148 of the transistor 146 is connected with circuit ground through a forward biasing potential source 150. The influence of the forward biasing potential 150 is, however, overcome by means of a reverse biasing influence provided by the variable resistor or rheostat 151 connected with the base 144 and acting as a bleeder in combination with resistor 152 across a power supply having terminals at 154 and 156. The collector 158 of the transistor 146 is in turn connected with a reverse biasing potential source 160 through load resistors 162 and 164.

In accordance with the present invention and not shown in the above-identified U.S. patent application resistor 164 has connected in shunt therewith a capacitor 166 whose value forms a time constant circuit with resistor 164 having a period in excess of the recurrence period of the synchronizing pulse component of the television signal. The upper extremity of the resistor 164 is in turn connected with the base 168 of another semiconductor signal translating device such as a transistor 170. The emitter 172 of the transistor 170 is connected with a source of forward biasing potential 174 which is in turn connected with the negative terminal of the power supply 160. The collector 176 of transistor 170 is connected through a load resistor 178 to circuit ground. A capacitor 180 connected across the resistor 178 acts as a filtering influence on the automatic gain control voltage developed at collector 176 as described hereinafter.

In the operation of the embodiment of the invention shown in Figure 4, the reverse bias caused to appear in the emitter-base circuit of the transistor 146 by means of the adjustment of the rheostat 151 is of such magnitude as to prevent conduction in the transistor 146 for signal excursions below or less than level $e_1$ (negative going video signal waveform 142). The level $e_1$ is established just beyond the blanking level of the incoming video signals. The value of the load resistor 162 connected with the collector 158 of transistor 146 is such that collector saturation occurs in the transistor 146 for signal levels beyond $e_2$ (waveform 142). The level $e_2$ is established just under the tips of sync in the incoming television signal. This will cause an output waveform 184 to appear across the load resistor 162 which will represent separated synchronizing signal whose upper extremity $e'_2$ corresponds to collector saturation in the transistor 146 and whose lower extremity $e'_1$ is defined by the net emitter-base cutoff voltage imposed on the transistor. Thus, should the incoming signal increase in amplitude, the amplitude of the synchronizing pulse 184 would not increase.

The operation of the embodiment thus far described is in accordance with the above-identified Goodrich patent application, however, in accordance with the above discussion pertaining to the novel pulse widthening effect permitted by the present invention, the duty cycle of the synchronizing pulses 184 will increase (see Figure 1*b*) as the incoming signal increases in amplitude beyond that required to reach collector saturation. This will result in an increase in the average current flow through the resistor 164 which will tend to make the base 168 of transistor 170 more positive with respect to its emitter 172 than theretofore. This condition will increase the emitter-collector conduction in the transistor 170 and cause the upper extremity of the collector load resistor 178 to become more negative with respect to circuit ground. As above explained, this potential is applied directly to the automatic gain control treminal of the television receiver circuitry included in block 128. In conventional ACG systems this increase in negative AGC potential will reduce the gain of the television receiver and tend to maintain the amplitude of signal applied to the video signal reproducing system 134 at a constant level.

In the event that the received television signal drops in amplitude, the reverse action will be noted. Under these conditions the average current through resistor 164 will drop due to a narrowing of the synchronizing waveform current envelope passing through the emitter-collector path of transistor 146. In the limit the narrowing of the synchronizing pulse waveform 184 will give way to a reduction in its amplitude as a function of further decrease in received signal strength due to the condition of collector saturation no longer obtaining. The reduced current through resistor 164 will reduce the forward bias on the transistor 170 and reduce the current flow through the resistor 178 thereby effecting a reduction in the negative value of automatic gain control potential to the automatic gain control potential 140. This will increase the gain of the television receiver so as to effect a compensation for the initial decrease in received signal.

Although the novel pulse widthening effects accompanying the practice of the present invention have been shown in connection with but a few specific forms of apparatus, it is contemplated that the controllable pulse widthening technique disclosed herein will have application in other electrical signal systems. For example, although the extended linear relation range of collector to emitter current of a transistor amplifying device in pulse signaling systems has been illustrated in connection with an automatic gain control system, it is evident that this pulse widthening technique will find utility wherever a semiconductor signal translating device, such as the transistor, is utilized to handle pulsed wave forms and to deliver an output voltage representative of the peak amplitude of the applied input voltage.

What is claimed is:

1. In a signal processing circuit the combination of: a source of electrical signal having excursions of variable amplitude in excess of a predetermined minimum; a semiconductor signal translating device having electrodes corresponding to an emitter, base and collector; input circuit means connected between said emitter and base; connections between said signal source and said emitter; output circuit means connected between said collector and said emitter, said output circuit means including a resistor having a value sufficiently large to permit collector saturation in said semiconductor signal translating device for signal excursions in excess of said predetermined minimum, said collector saturation acting to effectively clip said excursions to define signal pulses in said output circuit, the widths of said signal pulses being a function of the extent said electrical signals have driven said device beyond collector saturation; a time constant circuit included in said output circuit means, the time constant value of said time constant circuit being sufficiently long to respond to changes in the duty cycle of current waveform in said output circuit to yield an output voltage which varies in magnitude as a function of the amplitude of said electrical signal in excess of said predetermined minimum; and utilization means responsive to said voltage connected with said time constant circuit.

2. In a signal processing circuit, the combination of: a source of electrical signal having recurrent pulse components of varying amplitude; a semiconductor signal translating device having electrodes corresponding to an emitter, base and collector; input circuit means connected between said emitter and said base; output circuit means connected between said collector and said emitter; signal coupling means connected between said signal source and said input circuit for applying to said input circuit a pulse component conditionally reaching a predetermined minimum level in the direction of collector saturation and conditionally extending beyond said predetermined level; resistance means included in said output circuit so as to conduct collector current, the value of said resistance means being such to insure collector saturation at a level corresponding to said predetermined minimum input signal level; a capacitance means connected in shunt with at least a portion of said resistance means to form a time constant circuit; and utilization means responsive to changes in the duration of said collector saturation connected across said capacitance means.

3. In a signal processing circuit, in accordance with claim 2, wherein the value of said capacitance means is related to the value of that portion of said resistance means across which said capacitance means is connected, to form a time constant value in excess of the recurrence period of said recurrent pulse component.

4. In a variable width pulse generating system, the combination of: a source of recurrent pulses of predetermined minimum width and variable amplitude; a semiconductor signal translating device having electrodes corresponding to an emitter, base and collector; input circuit means connected between said emitter and said base; output circuit means connected between said collector and said emitter including a resistor of sufficient value to permit collector saturation to obtain in said semiconductor signal translating device for input circuit signal excursions in excess of a predetermined level; variable bias means included in said input circuit for controllably altering the average emitter-base bias imposed upon said semiconductor device; and utilization means responsive to changes in the duration of collector saturation connected to said output circuit means.

5. In a variable width pulse generating system, according to claim 4, wherein said last named means is responsive to an intelligence signal.

6. In a signal processing circuit, the combination of: a source of intelligence signals having a recurrent pulse component of a predetermined recurrence period; a semiconductor signal translating device having electrodes corresponding to an emitter, base and collector; input circuit means connected between said emitter and said base; resistance means connected between said collector and said input circuit; a reverse collector bias voltage means connected in series with said resistance means, the value of said bias voltage being chosen with respect to said resistance means so as to permit dynamic collector current saturation in said collector semiconductor translating device; a connection between said input circuit and said source of intelligence signals, the point of connection to said input circuit being such as to permit driving of said semiconductor translating device into collection saturation by said signals; and a capacitor connected in shunt with but a portion of said resistance means, the value of said capacitor being so chosen relative to the ohmic value of that portion of said resistance means across which it is connected as to produce a time constant circuit having a time constant value in excess of said predetermined pulse component recurrent rate.

7. In a pulse width modulation signal communication system, the combination of: a source of electrical pulses having a predetermined recurrence rate; an amplitude modulation system having an input circuit, an output circuit and modulating signal circuit; signal coupling means connected from said signal source to said input circuit; a source of intelligence signal to be communicated, said intelligence signal source having an output circuit; signal coupling means connected between said signal intelligence source and said modulation system signal circuit; a semiconductor signal translating device having electrodes corresponding to an emitter, base and collector; signal input means connected between said base and emitter; a signal output circuit connected between said collector and said emitter, said signal output circuit including a source of collector reverse biasing potential; resistance means included in said output circuit of sufficient value as to provide collector saturation for pulse amplitudes applied to said input circuit in excess of a predetermined level, whereby pulses in excess of said predetermined level are effectively broadened in duration as they appear translated in said output circuit.

8. In an electrical signal processing circuit for television systems, the combination of: a circuit ground; a video signal terminal means at which conditionally appears a video signal, said terminal means sustaining a predetermined direct current resistance path to circuit ground; a first semiconductor signal translating device having a base, emitter and collector; a direct current connection from said video signal output terminal means to said base; biasing means connected between said emitter and said circuit ground; a ground referenced source of collector biasing potential; load resistance means connected from said collector biasing source to said collector to form an alternating current output signal circuit; a second semiconductor device having electrodes corresponding to an emitter, base and collector; a direct current connection from a point on said first semi-conductor device collector load resistance means to said second semiconductor device base electrode; a source of emitter biasing potential for said second semiconductor device; means connecting said last named biasing potential source between said load resistance means and said second semiconductor device emitter; and a direct current conducting time constant circuit connected from said second semiconductor device collector to circuit ground to form a direct current output signal circuit.

9. In a signal processing circuit, the combination of: a source of electrical signal having a recurrent pulse component; a semiconductor signal translating device having electrodes corresponding to an emitter, base and collector; input circuit means connected between said emitter and said base; output circuit means connected between said collector and said emitter; signal coupling means connected between said signal source and said input circuit for applying to said input circuit a pulse component conditionally reaching a predetermined minimum level in the direction of collector saturation and conditionally extending beyond said predetermined level; a source of collector reverse bias potential included in said output circuit, resistance means included in said output circuit and connected between said collector and said reverse bias potential so as to conduct collector current, the value of said resistance means being such to establish collector saturation at a level corresponding to said predetermined minimum input signal level; and a capacitance means connected in shunt with a portion of said resistance means adjacent said bias source thereby to permit alternating current voltage to appear across the unshunted portion of said resistance means as well as an amplitude indicating signal across the shunted portion of said resistance means.

10. In a signal processing circuit, the combination of: a source of electrical signal having a recurrent pulse component; a semiconductor signal translating device having electrodes corresponding to an emitter, base and collector; input circuit means connected between said emitter and said base; output circuit means connected between said collector and said emitter; signal coupling means connected between said signal source and said input circuit for applying to said input circuit a pulse component conditionally reaching a predetermined minimum level in the direction of collector saturation and conditionally extending beyond this said predetermined level; bias means included in said input circuit for dictating the degree of collector saturation effected by a given signal input excursion and wherein there is additionally provided means for controlling the value of said input circuit bias means in accordance with a signal voltage; resistance means included in said output circuit so as to conduct collector current, the value of said resistance means being such to establish collector saturation at a level corresponding to said predetermined level; and capacitance means connected in shunt with at least a portion of said resistance means to form a time constant circuit.

11. In a signal processing circuit the combination of: means providing a source of electrical signals having excursions in excess of a predetermined level; a semiconductor signal translating device having electrodes corresponding to an emitter, base and collector; input circuit means connecting said signal source between said base and emitter such that said excursions are adapted to drive said device by variable amounts beyond collector saturation; output circuit means connected between said emitter and collector, said output circuit means including an impedance element having an impedance value sufficiently large to permit collector saturation in said semiconductor signal translating device for signal excursions in excess of said predetermined level, the duration of saturation of said collector current being a function of the amplitude of said pulses beyond said predetermined level; and utilization means responsive to the duration of saturation of said collector current coupled to said output circuit.

12. In a signal processing circuit the combination of: means providing a source of recurrent electrical signal pulses of substantially the same time duration and having excursions subject to variations of amplitude in excess of a predetermined level; a semiconductor signal translating device having electrodes corresponding to an emitter, base and collector; input circuit means connecting said source of recurrent electrical signals between said base and emitter; output circuit means including an impedance element having an impedance value sufficiently large to permit collector saturation in said semiconductor signal translating device for signal pulse excursions in excess of said predetermined level connected in circuit between said collector and emitter, said collector saturation acting to effectively clip said excursions to provide signal pulses of substantially constant amplitude in said output circuit means, the duration of saturation of said collector current being a function of the amplitude of the recurrent electrical signal pulse from said source in excess of said predetermined level; and utilization means responsive to the duration of said collector current coupled to said output circuit.

13. In a signal processing circuit the combination of: means providing a source of recurrent electrical signal pulses of substantially the same width and of varying amplitude in excess of a predetermined level; a semiconductor signal translating device having electrodes corresponding to an emitter, base and collector; input circuit means connecting said source of recurrent electrical signals between said base and emitter; output circuit means including a resistor having a resistance value sufficiently large to permit collector saturation in said semiconductor signal translating device for signal pulse excursions in excess of said predetermined level connected in circuit between said collector and emitter, said collector saturation acting to effectively limit said excursions to provide signal pulses of substantially constant amplitude in said output circuit means, the width of the pulses in said output circuit being a function of the amplitude of the recurrent electrical signal pulses from said source in excess of said predetermined level; and utilization means responsive to the width of said pulses coupled to said output circuit.

14. In a television receiving system the combination of: a variable gain amplifier for television signals, demodulating means coupled to said amplifier providing a composite video signal including a video component and recurrent synchronizing pulses having amplitude excursions in excess of that of said video component; a transistor having an emitter, base and collector electrodes; means coupling said demodulating means between said emitter and base electrodes for applying said composite television signal thereto; output circuit means connected between said emitter and collector electrodes, said output circuit means including a resistor having a resistance value sufficiently large to permit collector saturation in said transistor for signal excursions corresponding to said recurrent synchronizing pulses, the width of said synchronizing pulses appearing in said output circuit being a function of the extent that said synchronizing pulses drive said transistor into saturation; capacitive means connected with at least a portion of said resistor to integrate the pulses appearing in said output circuit to provide a direct current control voltage of a magnitude related to the amplitude of said recurrent synchronizing pulses; and means applying said direct current control voltage to said variable gain amplifier to control the gain thereof inversely with the amplitude of said synchronizing pulses.

References Cited in the file of this patent

UNITED STATES PATENTS

| | | |
|---|---|---|
| 2,541,322 | Barney | Feb. 13, 1951 |
| 2,591,961 | Moore et al. | Apr. 8, 1952 |

(Other references on following page)

UNITED STATES PATENTS

| | | |
|---|---|---|
| 2,605,306 | Eberhard | July 29, 1952 |
| 2,663,800 | Herzog | Dec. 22, 1953 |
| 2,725,317 | Kleimack | Nov. 29, 1955 |

OTHER REFERENCES

Article, "Some Transient Properties of Transistors," by Bassett and Tillman, Brit. Journal of Applied Physics 4, 116–117, April 1953.

Article and discussion, "A Method of Designing Transistor Trigger Circuits," by Williams and Chaplin, Institution of Electrical Engineers, vol. 100, part 3, pages 228 to 248, 1953.

Article, "A Transistor Packaged Circuit for Multifunctional Switching Applications," by R. L. Trent, in pages 437 to 461 of "The Transistor," published by Bell Telephone Laboratories, Dec. 4, 1951.